(12) United States Patent
Hill et al.

(10) Patent No.: US 6,516,450 B1
(45) Date of Patent: Feb. 4, 2003

(54) VARIABLE DESIGN RULE TOOL

(75) Inventors: Wiley Eugene Hill, Moss Beach, CA (US); Kurt Taylor, San Jose, CA (US); Chern-Jiann Lee, Los Altos, CA (US); Rithy Hang, San Jose, CA (US); Todd Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/476,955

(22) Filed: Jan. 3, 2000

(51) Int. Cl.[7] ............................................. G06F 17/50
(52) U.S. Cl. ..................................... 716/4; 716/5
(58) Field of Search ......................... 716/1, 4, 5

(56) References Cited

U.S. PATENT DOCUMENTS 5,559,997 A * 9/1996 Tsuchida et al. ............. 703/13
5,681,674 A * 10/1997 Fujimoto ...................... 430/22
6,063,132 A * 5/2000 DeCamp et al. ............... 716/5

OTHER PUBLICATIONS

Dekker, R. et al., "A realistic fault model and test algorithms for SRAM's", Jun. 1990. IEEE, pp. 567–572.*
Ilyoung, Kim et al., "Built in self repair for embedded high density SRAM", Oct. 1998. IEEE, pp. 1112–1119.*
Rajsuman, "An algorithm and design to test RAM's", May 1992. IEEE, pp. 439–442.*

* cited by examiner

Primary Examiner—John F. Niebling
Assistant Examiner—Stacy Whitmore
(74) Attorney, Agent, or Firm—Foley & Lardner

(57) ABSTRACT

A variable design tool utilizes memory units to determine at which point a design rule fails. The variable design tool can provide a bit map indicating the points of failures for particular rules. The bit map can also be utilized to determine misalignment errors. The memory cells, typically SRAM units are arranged in 4×4 matrices which are arranged in four 16×16 matrices.

21 Claims, 11 Drawing Sheets

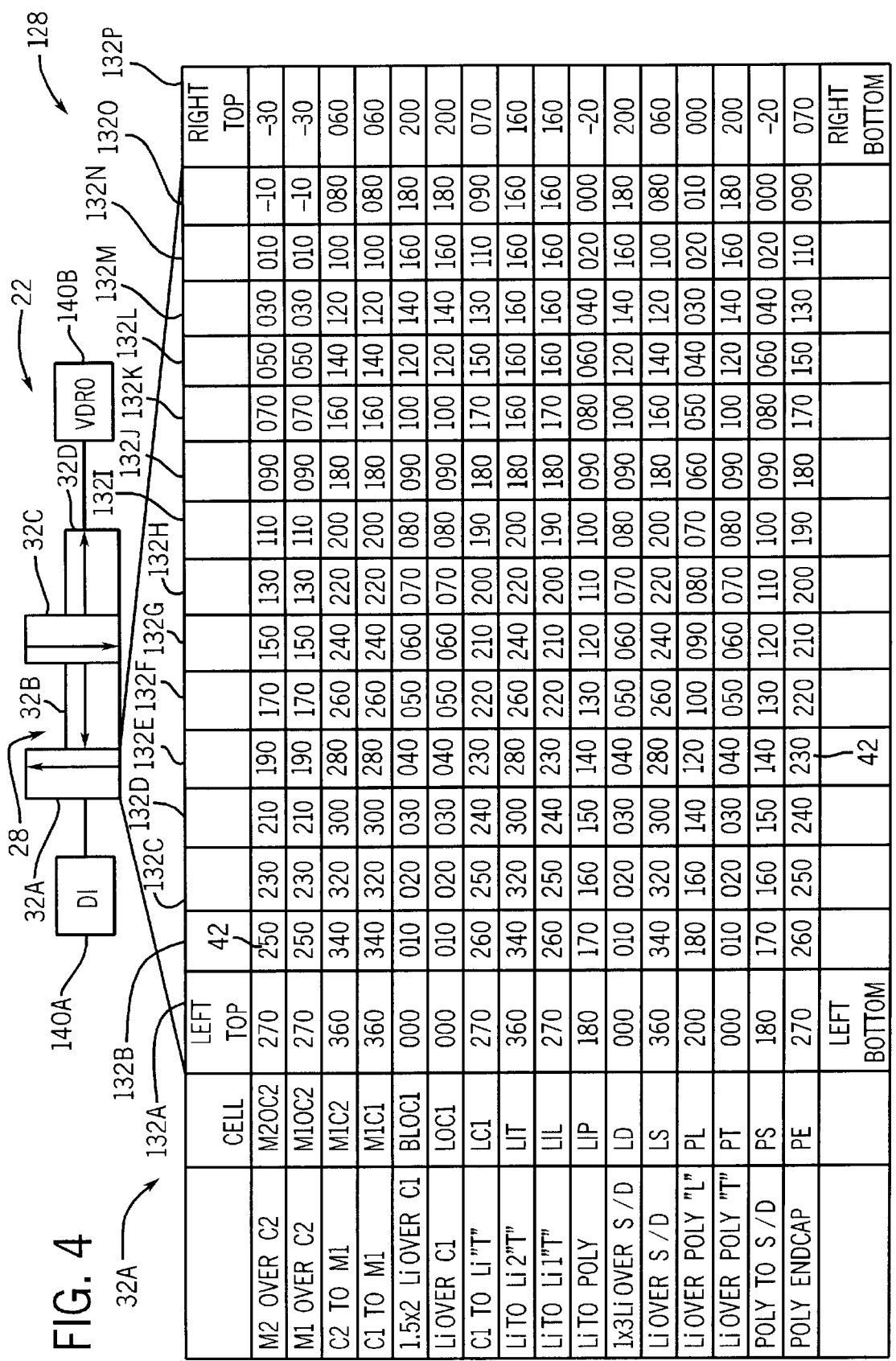

FIG. 5

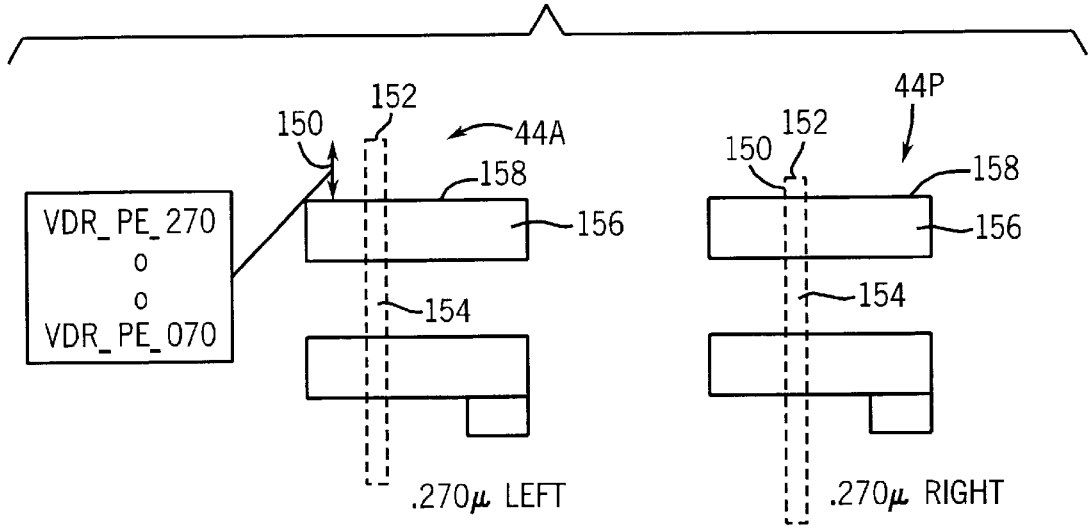

R30 OVERLAP OF R10 (POLY ENDCAP RULE). STARTING AT THE LEFT THERE IS A 4x4 ARRAY OF IDENTICAL CELLS WITH THE ENDCAP RULE AT MINIMUM OF .27. THIS IS SUCCESSIVELY TIGHTER FOR EACH 4x4 GROUP BY 10nm TO THE RIGHT UNTIL THE ENDCAP IS 100nm TIGHTER. FROM 100 TO 200nm THE INCREMENT IS 20nm PER 4x4 GROUP. AT EXTREME RIGHT THE OFFSET IS .200μ.

FIG. 6

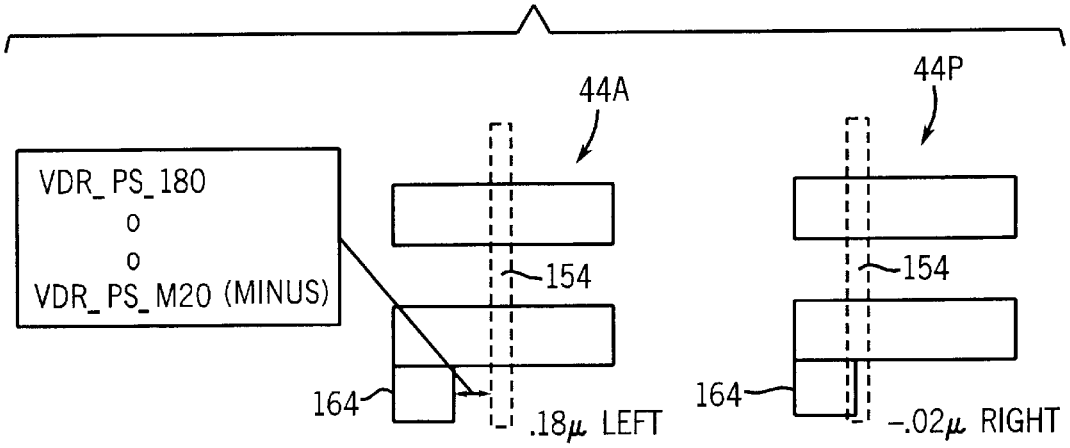

R30 MINIMUM OVERLAP WITH S/D ROUNDING. AT THE LEFT SPACING IS AT THE DESIGN RULE OF .18μ. EACH 4x4 IT IS .010μ TIGHTER REACHING .150 TIGHTER AT THE RIGHT OF ROW.

R59 OVERLAP OF R10

R59 INTERSECT R10 (Li-ACTIVE CONTACT WIDTH WITH S/D ROUNDING) USE BIT LINE CONTACT.

R58 TO R30 (Li TO GATE) Li "T" MIGHT BULDGE INTO POLY. .180µ SPACING AT LEFT TIGHTENED EACH 4x4 .010µ TIGHTER TO UNTIL Li TO POLY IS .030µ AT RIGHT.

R58 OVERLAP OF R60 (1x3 Li OVERLAP OF C1) USE BIT LINES.

R58 OVERLAP OF R60 (1.5x2 Li OVERLAP OF C1) JUST LIKE 8 EXCEPT Li SIZE IS CHANGED

R65 SPACE TO R70 (M1 TO C2) FAILURE IS INTERNAL SHORT TO M2 Vss OR Vcc ABOVE C2.

R65 OVERLAP OF R70 (M1 TO C2) USE BIT LINE CONTACT. .150µ OFFSET LEFT TO RIGHT.

R75 OVERLAP OF R70 (M2 OVERLAP C2)

VARIABLE DESIGN RULE TOOL

FIELD OF THE INVENTION

The present invention relates to the design and manufacture of integrated circuits (ICs) or semiconductor devices. More particularly, the present invention relates to an apparatus for and a method of determining design rule parameters for semiconductor wafers or integrated circuits.

BACKGROUND OF THE INVENTION

Integrated circuits are manufactured on semiconductor wafers according to design rules. Design rules typically relate to parameters associated with the manufacture of the integrated circuit. Design rules can specify the fabrication constraints associated with the manufacture of a device. For example, design rules can relate to various lithographic tolerances between structures on a semiconductor device, feature sizes, layer thickness, implant dosages, element dimensions or other criteria. The design rules can generally mandate the minimum feature size, overlap requirements, separation (spacing) requirements, or other parameters necessary to ensure that a fabricated device operates properly.

The design rules which proscribe IC design must be proven. Typically, a set of design rules are proven by fabricating an IC designed according to a design rule set and assuring proper operation of the fabricated IC. The efficacy of the design rules are presumed when the fabricated IC is shown to be functional.

For example, design rules for an IC used in amplifier circuits have been tested by providing power devices on a wafer. The power devices are built according to design rule parameters which are deliberately adjusted or offset. After manufacture, the power devices are tested to determine at which point the structure failed. Specifically, in an IC including doubly diffused metal oxide semiconductor (DMOS), a plurality of power devices are arranged in an array. Design rule parameters are adjusted or offset for each power device in the array. After the wafer is manufactured, the power devices are tested to determine which power devices failed. Analysis of failing power devices demonstrates the point of offset at which failure occurred. Thus, design rules associated with operable power devices are proven.

According to another example, design rules can be proven by providing a large semiconductor memory on a wafer. Each memory unit is identical and manufactured in accordance with fixed design rules. If the semiconductor wafer memory operates properly, the entire set of design rules is considered appropriate. This type of testing is more effective for uncovering random process errors rather than design rule tolerances.

If the memory does not operate properly, the memory is manually analyzed to determine the reason for the failure. For example, the wafer can be viewed through a microscope, a scanning electron microscope (SEM), or KLA inspection tool to determine the reason for the device failure. Alternatively, electrical testing or other diagnostic tools can determine the reason for the device failure. Manual analysis is time consuming and difficult, particularly when a large number of the design rules can cause the failure.

While the preceding methods for proving design rules are effective, they require iterations of design and fabrication as well as complicated manual analysis. Thus, there is a need for a variable design rule tool which allows a set of design rules to be tested quickly. Further still, there is a need for a method of and apparatus for testing a number of design rules automatically and simultaneously. Even further still, there is a need for a tool which can isolate design rule parameters which cause semiconductor processing failures.

SUMMARY OF THE INVENTION

One exemplary embodiment relates to a variable design rule tool. The design rule tool includes a matrix of units having a plurality of rows and columns. The matrix is disposed on a semiconductor substrate. The units in a particular row are associated with a particular semiconductor fabrication design rule; a parameter associated with the semiconductor fabrication design rule decreasing in tolerance from one end to the opposite end of the particular row or column. The variable design rule tool also includes an interface coupled to the matrix and a program. The interface receives data associated with the units. The program receives the data from the interface and determines a failure point associated with the parameter in response to the data.

Another embodiment relates to a wafer for use in a design test for a semiconductor fabrication system. The design test determines a particular value for a parameter associated with a device failure on a wafer. The wafer includes a plurality of memory units, each being associated with a selected value for the parameter. The design test allows the particular value to be determined in response to data associated with the units.

Yet another exemplary embodiment relates to a method of testing a design rule for an integrated circuit. The integrated circuit includes a plurality of memory units. The units are arranged in a plurality of rows and a plurality of columns. The units in a particular row or particular column are associated with a particular design rule. A parameter associated with a design rule varies from a first end to a second end of the particular row or column. The method includes providing data to the units, receiving the data from the units, analyzing the data to determine if a unit has failed, and determining the parameter associated with the failed unit.

BRIEF DESCRIPTION OF THE DRAWINGS

Preferred exemplary embodiments will hereafter be described with reference to the accompanying drawings, wherein like numerals denote like elements, and:

FIG. 4 is a representation of the variable design rule tool system illustrated in FIG. 1 and showing a set of design rules applied to one of the four matrices;

FIG. 5 is a block diagram of memory cells configured to test a poly end cap rule;

FIG. 6 is a block diagram of memory cells configured to test a poly to source/drain region overlap design rule;

DETAILED DESCRIPTION OF THE PREFERRED EMBODIMENTS

Figures 1, 3:
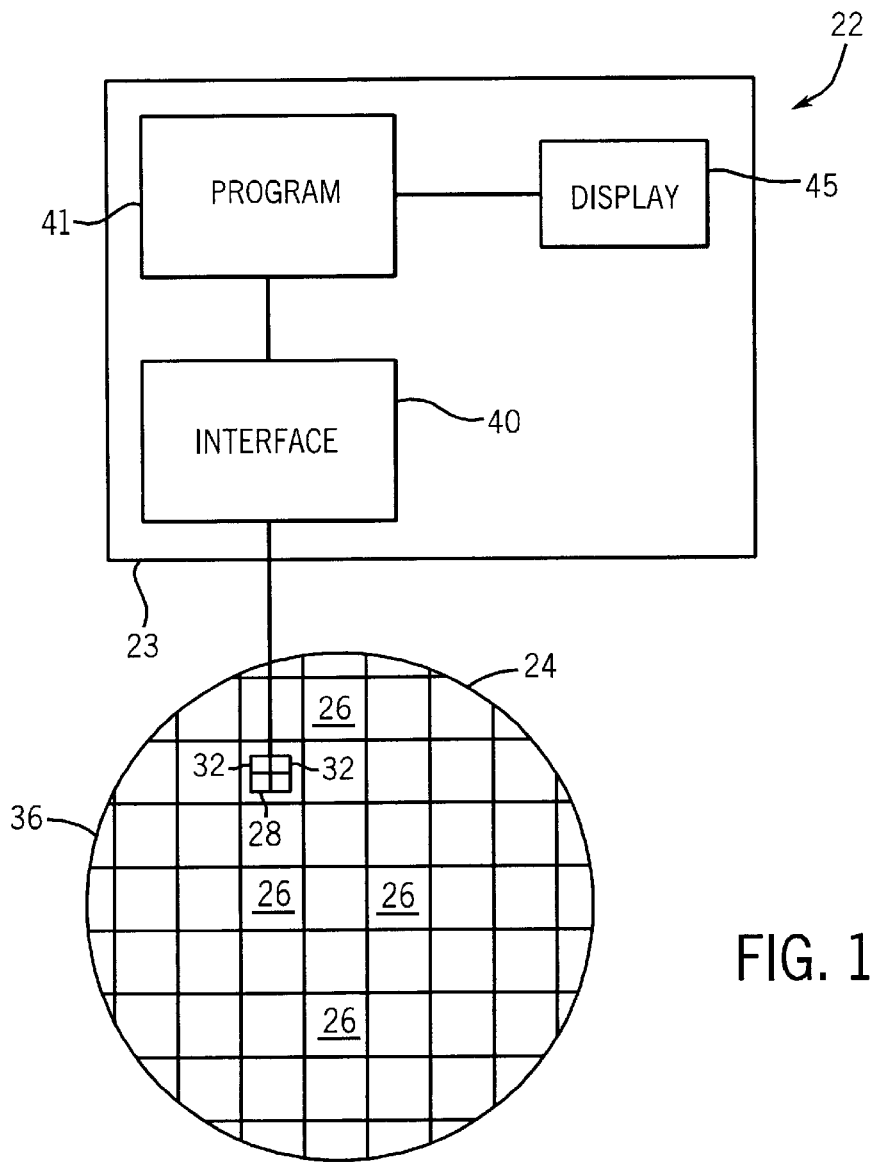
FIG. 1 is a block diagram of a variable design rule tool system having four matrices on a semiconductor wafer.
FIG. 3 is a more detailed block diagram of one of the units illustrated in FIG. 2, including sixteen memory cells.

With reference to FIG. 1, a variable design rule test system 22 includes an analyzer 23 and a semiconductor wafer 24. Analyzer 23 communicates with semiconductor wafer 24. Analyzer 23 includes an interface 40, a program 41 and a display 45. Wafer 24 can be any type of semiconductor wafer used to manufacture integrated circuits. Wafer 24 has a notch 36 utilized for positioning and handling wafer 24 during the fabrication process.

Wafer 24 can be divided into a number of chips 26 which can be packaged as electrical devices. At least one of chips 26 includes an array 28 of four matrices 32. Chips 26 can be part of any type of electrical devices, including a microprocessor, such as, the AMD Athlon™ and AMD-K6® microprocessors, a memory (DRAM, SRAM, etc.), a field programmable gate array, an amplifier, or other integrated circuits.

Analyzer 23 communicates with array 28 on wafer 24 through interface 40. Alternatively, interface 40 can be configured for communicating with a packaged or unpackaged chip 26 which includes array 28 of matrices 32. Matrices 32 are preferably arranged in four different orthogonal directions. Analyzer 23, including interface 40, program 41, and display 45, can be part of a workstation, a semiconductor fabrication tool capable of communicating with wafer 24 or other diagnostic device.

Program 41 can be a software program executed on a workstation. Alternatively, program 41 can be embedded software for a semiconductor fabrication tool or a hardware implementation for analyzing wafer 24. Program 41 is configured to analyze and filter data received through interface 40 from array 28. Program 41 utilizes the data to analyze appropriate parameters for design rules associated with the manufacture of wafer 24 and chips 26. Program 41 can display or print out the results of the analysis on display 45.

System 22 can advantageously be designed into a product, such as, chips 26, to detect systematic problems and design rule tolerances during prototype and commercial wafer fabrication. Array 28 of matrices 32 allows critical process parameters to be incrementally stressed from a nominal safe value to a point beyond known failures. Data is collected from array 28 by electrically checking the functionality of matrix 32. The functionality of matrix 32 represents the level at which process parameters have exceeded a functional limitation. In addition, comparisons between data from different matrices 32 can reveal registration errors. Accordingly, data or bit maps collected from array 28 through interface 40 show both the process capability and registration of a given process parameter in multiple orientations.

Information on stepping fields in the reticle can be easily extracted as array 28 is embedded within chip 26. Analysis is non-destructive and can be performed at wafer, chip, and package levels. The use of an array 28 provides significant advantages over discrete testing structures and provides the ability to collect data on wafer, chips and packages for a number of design rules in a single test iteration.

Matrices 32 in array 28 are preferably arranged in multiple orientations (e.g., the first is standard, the second is rotated 90 degrees, the third is rotated 90 degrees and flipped over a horizontal axis and a vertical axis, and the fourth is flipped over both the horizontal and vertical axis without a 90 degree rotation; the horizontal axis is the axis which is orthogonal to notch 36). Alternatively, different orientations and numbers of matrices 32 can be utilized.

Figure 2:
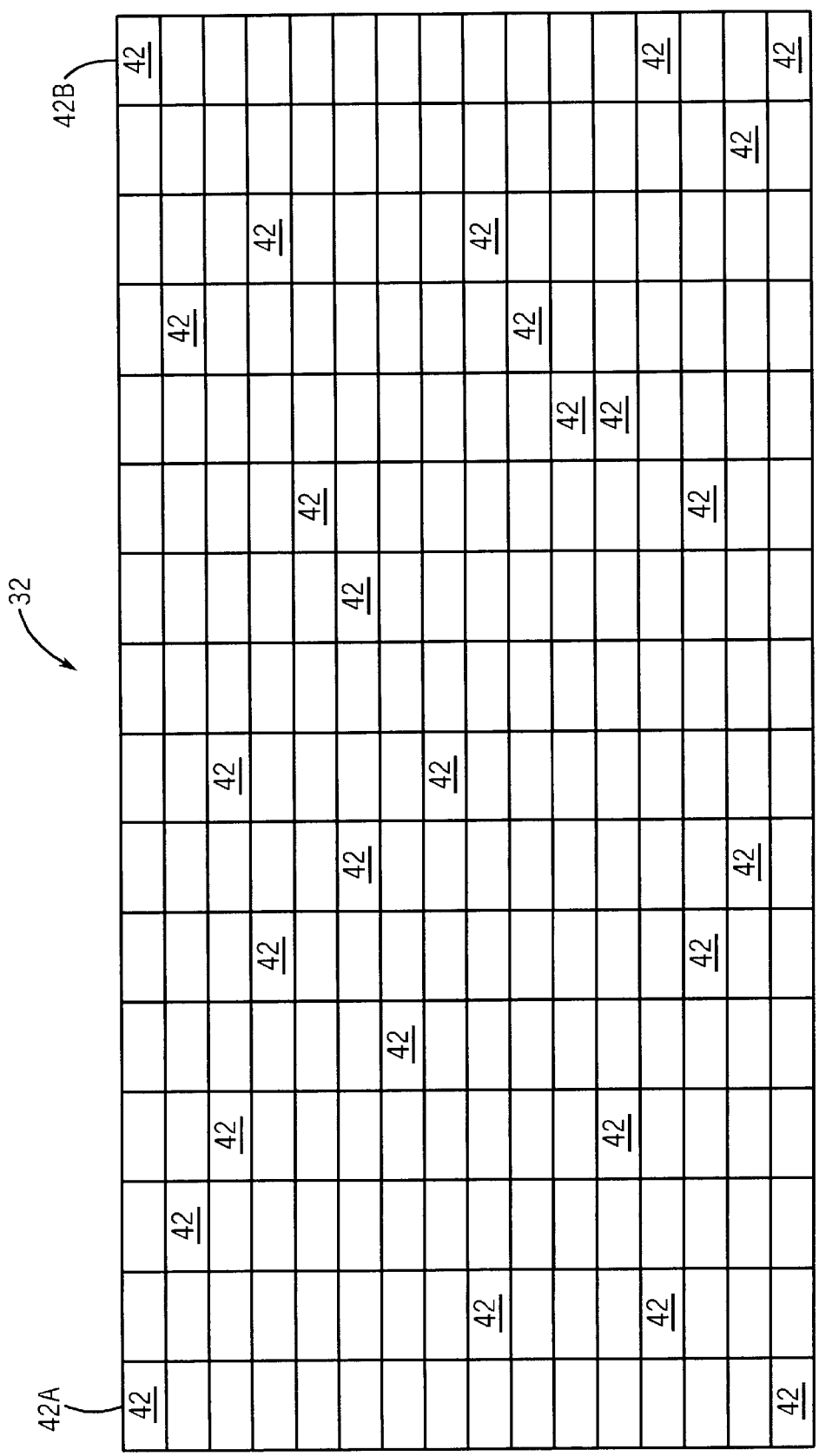
FIG. 2 is a more detailed block diagram of one of the four matrices illustrated in FIG. 1, the matrix includes units.

With reference to FIG. 2, matrix 32 of array 28 includes units 42. Preferably, matrix 32 includes sixteen rows of units 42 and sixteen columns of units 42. Preferably, each row of units 42 is configured in accordance with a particular design rule. The design rule is related to a parameter which is incrementally stressed across the row so that the parameter is least stressed in a first column 42A and most stressed in a sixteenth column 42B.

With reference to FIG. 3, unit 42 in matrix 32 (FIG. 2) is comprised of sixteen memory cells 44. Memory cells 44 are preferably identical to other memory cells 44 in unit 42. Array 42 is preferably arranged as a 4×4 matrix.

Memory cells 44 can be flash memory units, dynamic random access memory (DRAM) units, static (RAM) memory unit or other memory cells. Preferably, memory cells 44 are similar to conventional 6 transistor (6T) SRAM units.

The preferred 6T SRAM cell for memory cell 44 is preferably similar to an SRAM cell including two p-channel load transistors, two n-channel drive transistors, and two n-channel pass transistors. However, each cell 44 is enlarged so that the size of each feature and the distance between features are increase with respect to a conventional cell.

In this way, only the parameter associated with the particular design rule is stressed or at a near stressing point because the other features are well within safe manufacturing dimensions. Accordingly, failure is most likely due to the stressed parameter of the design rule being tested. Thus, design rule failures can be isolated from other failures because the other features are within conservative manufacturing tolerances.

The operation of system 22 will be discussed with reference to FIGS. 1–3 below. After wafer 24 including the array 28 has been fabricated, program 41 through interface 40 writes a logic '1' to each memory cell 44 in array 28. After writing a logic '1', program 41 through interface 40 reads each memory cell 44 to ensure that a logic '1' is stored. If a logic '1' is not stored in a memory cell 44, that memory cell 44 is deemed inoperable.

After testing array 28 for an ability to retain a logic '1,' program 41 through interface 40 writes a logic '0' to memory cells 44. After writing a logic '0', program 41 reads memory cell 44 to ensure that a logic '0' exists. If a logic '0' is not stored in a memory cell 44, that memory cell 44 is deemed inoperable.

By writing and reading both a logic '1' and '0' to memory cells 44 within array 28, program 41 determines which units 44 are fully operational and which units 44 are not. Program 41 uses the operable/inoperable data to determine the point at which a design rule fails. For example, program 41 can filter the data to determine when a particular number of memory cells 44 in a particular unit 42 fail. If the number of failing memory cells 44 in a particular unit 42 exceeds a particular number, the failure is considered to be associated with the parameter used in the design rule for that unit 42. A requirement for a particular number of units failing is utilized so that the data is not misinterpreted in light of other fabrication failures. For example, when at least five cells 44 of a unit 42 fail, unit 42 can be considered failed.

Additionally, program 41 can provide further analysis to determine whether a failed unit 42 is, in fact, a failure due to a design parameter exceeding an acceptable limit. For example, program 41 can ignore lone failures of units 42 and only consider the existence of a design rule failure when two or more adjacent units 42 in a row fail. Program 41 can filter the data to determine if two adjacent units 42 have failed. Generally, a design rule failure is manifested by all units 42 failing past a particular stress point (e.g., all units to the right of a particular unit failing). This technique prevents a random process error from being confused with a design rule failure. In addition, program 41 can analyze features in other rows and matrices to determine if the failure is due to a design failure or a random processing failure. Utilizing matrices 32 in four different orientations allows process variations which occur in vertical and horizontal directions to be isolated. Also, registration errors can be determined by comparing data from matrices 32.

Further, system 22 can identify the precise location of the design rule failure. For example, when a failure occurs in the fourth row and sixth column, an operator can view the exact location where the failure occurred. The failure is especially easy to locate because it is associated with a particular known structure (the design rule of the row). Further, data indicating whether a failure occurred when reading a logic '1' or '0' can also be used to isolate the failure. For example, a cell 44 which can provide a logic '1', but not a logic '0' may indicate a bit line being shorted to VCC. Thus, detailed manual analyses of wafer 24 is not required to locate the precise location of the failure.

With reference to FIGS. 4–19, an exemplary array 28 similar to array 28 discussed with reference to FIGS. 1 and 2 is described below as follows. Array 28 is coupled to an interface including a data input interface 140A and a data output interface 140B. The combination of interfaces 140A and 140B is similar to interface 40 discussed with reference to FIG. 1.

In FIG. 4, array 28 includes four identical matrices 32A–D in four orthogonal configurations. Matrix 32A includes sixteen rows 130A–P related to sixteen different design rules. Matrix 32A also includes sixteen columns 132A–P. Matrix 32A includes 256 units 42, each comprised of four memory cells 44 (FIG. 3). The relationship of each of rows 130A–P to its particular design rule (and the figure associated with the particular design rule) is set forth in Table 1 below.

TABEL 1

Exemplary Rule Set for FIG. 4.

Figure 14:
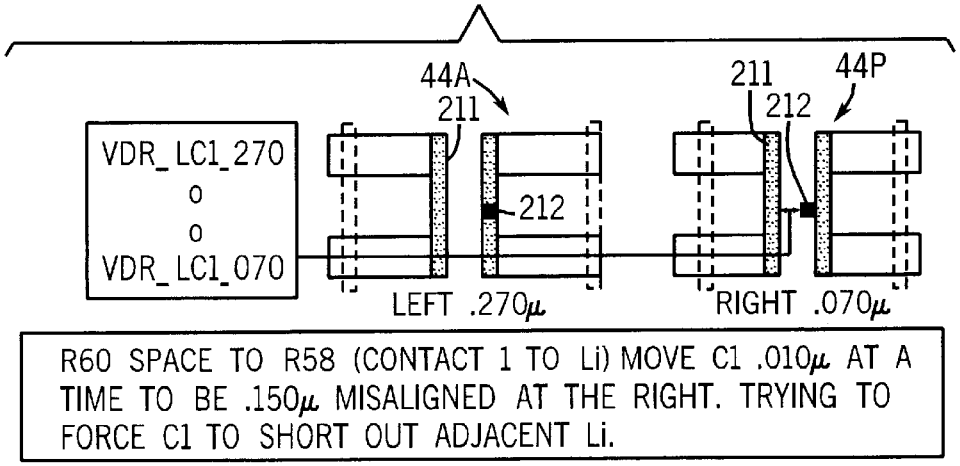
FIG. 14 is a block diagram of memory cells configured to test a first level contact to LI spacing design rule.
Figure 15:
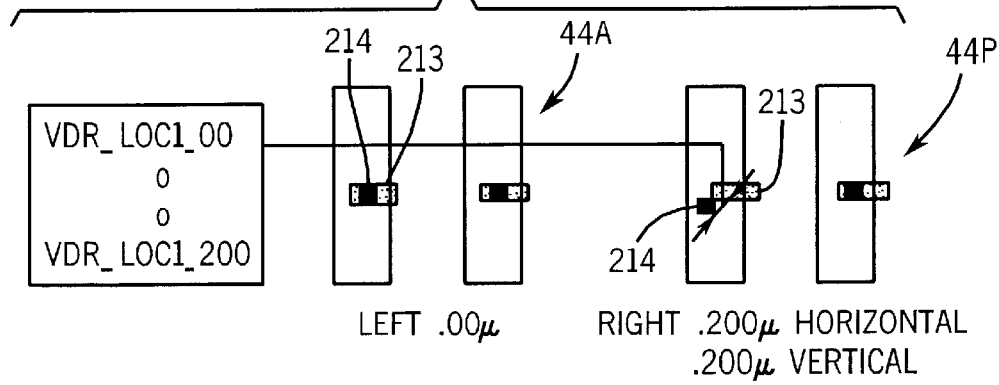
FIG. 15 is a block diagram of memory cells configured to test a 1×3 LI to first level contact design rule.

| | |
|---|---|
| Row 130P | R30 overlap of R10 (poly endcap rule, FIG. 5) |
| Row 130O | R30 minimum overlap with S/D rounding (poly to source/drain region overlap, FIG. 6) |
| Row 130N | R58 to R30 (T-shaped LI to poly overlap, FIG. 7) |
| Row 130M | R58 intersect R30 (Li to poly intersect width, FIG. 8) |
| Row 130L | R59 overlap of R10 (LI to active region overlap, FIG. 9) |
| Row 130K | R59 intersect R10 (Li to active contact width, FIG. 10) |
| Row 130J | R58 to R30 (LI to poly spacing, FIG. 11) |
| Row 130I | R58 to R58 (T-shaped LI to LI spacing, FIG. 12) |
| Row 130H | R58 to R58 (T-shaped LI to T-shaped LI spacing, FIG. 13) |
| Row 130G | R60 space to R58 (first level contact to LI spacing, FIG. 14) |
| Row 130F | R58 overlap of R60 (1 × 3 LI to first level contact overlap, FIG. 15) |
| Row 130E | R58 overlap of R60 (1.5 × 2 LI to first level contact overlap not shown similar to FIG. 15) |
| Row 130D | R65 space to R60 (first level metal layer to first level contact overlap, FIG. 16) |
| Row 130C | R65 space to R70 (first level metal layer to second level contact spacing, FIG. 17) |
| Row 130B | R65 overlap of R70 (M1 overlap C2) (first level metal layer to second level contact overlap, FIG. 18) |
| Row 130A | R75 overlap of R70 (M2 overlap C2) (second level metal layer to second level contact overlap, FIG. 19) |

Each rule identified in row 130A–P is stressed in terms of the parameter associated with the design rule. Values for the parameter are shown in columns 132A–P of FIG. 4. The stressing of each rule is discussed in more detail below with reference to FIGS. 5–19.

FIGS. 5–19 each disclose a memory cell 44A and a memory cell 44P. Memory cells 44A and memory cell 44P are preferably SRAM memory cells similar to memory cells 44 (FIG. 3). Only the portion of the SRAM unit relevant to the design rule is shown in each of FIGS. 5–19. Memory cell 44A is associated with one extreme value of a tested design rule parameter while memory cell 44P is associated with the opposite extreme.

In FIG. 5, a portion of memory cell 44A and memory cell 44P includes a polysilicon gate 154 and an active region 156. Cells 44A and 44P are identical throughout row 130P except that the distance between an end 152 of polysilicon gate 154 and a border 158 of region 156 is adjusted in accordance with the poly end cap rule associated with the row 130P. For example, the distance between end 152 and border 158 is 0.270 microns (see memory cell 44A) as shown in column 132A and 0.070 microns (see memory cell 44P) as shown column 132P. As shown in columns 132A–P, the distance is successively smaller by 10 nanometers until a distance of 0.170 microns is reached in column 132K. After column 132K, the distance is successively reduced 20 nanometers until the distance 0.070 microns is reached in column 132P.

In FIG. 6, cells 44A and 44P are identical except that a distance between polysilicon gate 154 and active region 164 is adjusted from 180 nanometers (see memory cell 44A) in column 132A of row 130O to −0.020 microns (see memory cell 44P) in column 132P of row 130O. Region 164 can be associated with a pass gate on the bit line associated with cells 44A and 44P. Row 130O tests the overlap required between active region 164 and polysilicon gate 154.

A negative parameter in row 1300 indicates that region 164 and polysilicon gate 154 overlap by the particular parameter. The distance is successively decremented by 0.010 microns across columns 132A–132K. When the distance reaches 0.080 microns, the distance is successfully decremented by 0.020 microns across columns 132L–P.

Figure 7:
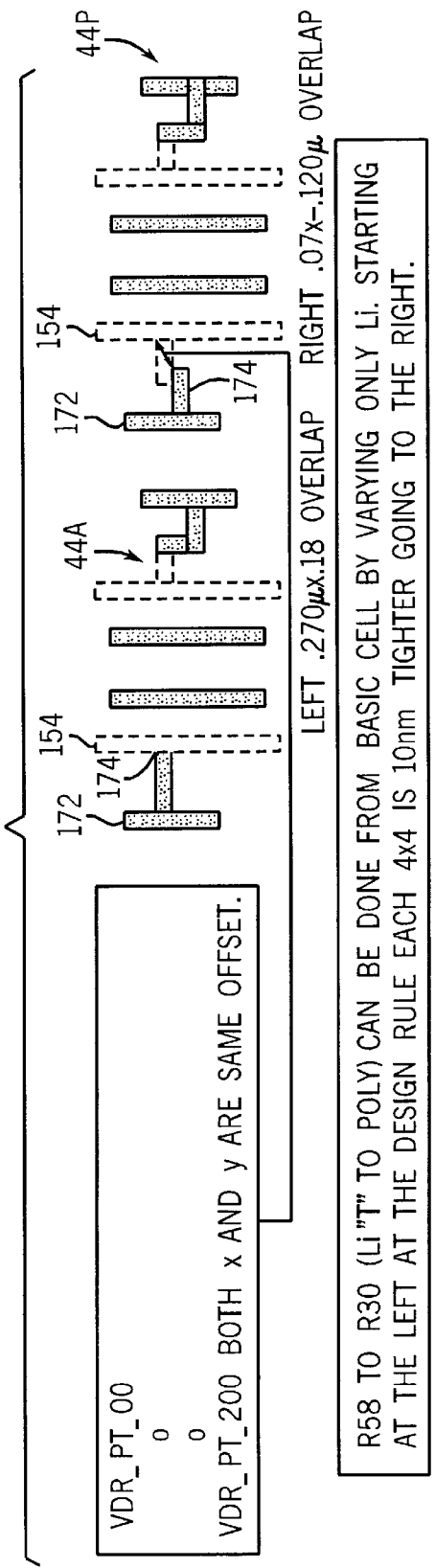
FIG. 7 is a block diagram of memory cells configured to test a T-shaped local interconnect (LI) to poly overlap design rule.

In FIG. 7, portions of cells 44A and 44P include a T-shaped local interconnect 172 and polysilicon gate 154. According to row 130N, cells 44A and 44P are identical except for the overlap distance at a point 174. The overlap distance is adjusted diagonally, e.g., equally in the X and Y direction. The overlap distance changes from zero (see memory cell 44A) to 0.200 microns (see memory cell 44P) across columns 132A and 132P. The distance is incremented successively by 0.010 microns until column 132K is reached and incremented by 0.020 microns from column 132K to column 132P. Row 130N tests the maximum offset at point 174 before gate 154 is disconnected from interconnect 172.

Figure 8:
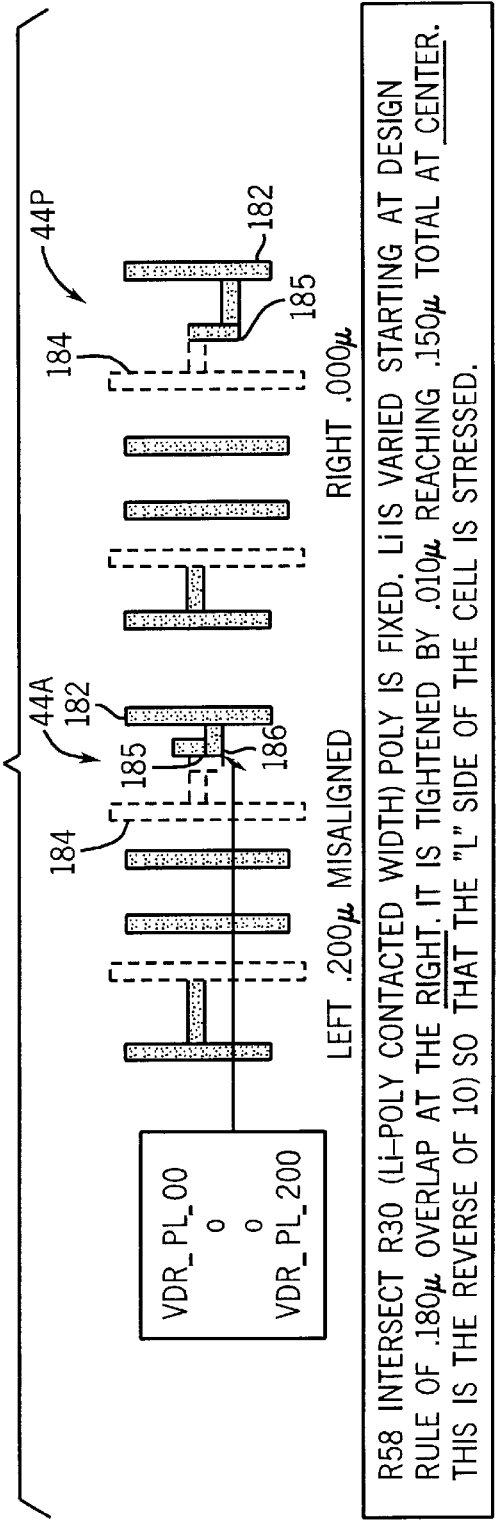
FIG. 8 is a block diagram of memory cells configured to test a LI to poly intersect width design rule.

In FIG. 8, portions of cells 44A and 44P are identical except that the alignment between a local interconnect 182 is adjusted from a polysilicon line 184 across columns 132A–P in row 130M. A distance 186 between a corner 185 of polysilicon line 184 and local interconnect 182 is adjusted from 0.200 microns (see memory cell 44A) in column 132A to 0 microns (see memory cell 44P) in column 132P. The distance is successively decremented by 0.020 microns until column 132F and thereafter decremented by 0.010 microns until column 132P. Row 130M tests the distance at which polysilicon 184 and local interconnect 182 are not connected.

Figure 9:
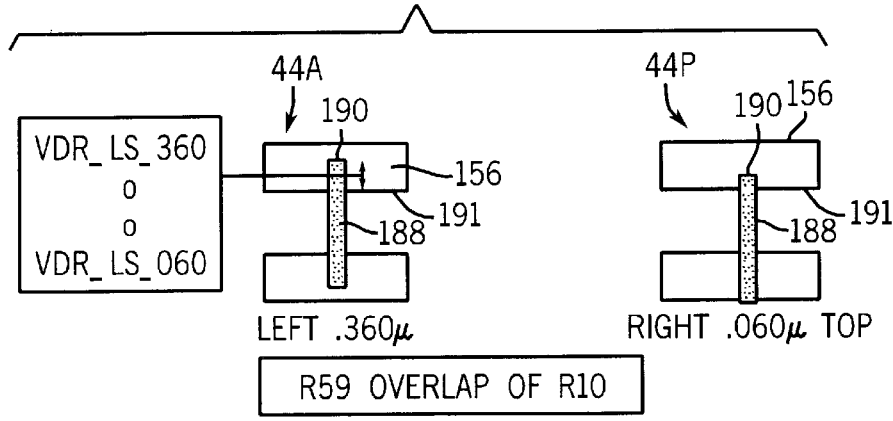
FIG. 9 is a block diagram of memory cells configured to test a LI to active region overlap design rule.

In FIG. 9, cells 44A and 44P are identical except that the overlap between a border 191 and interconnect 188 is adjusted across row 130L. The distance is measured from an end 190 to border 191 of active region 156. The distance is adjusted from 0.360 microns (see memory cell 44A) to 0.060 microns (see memory cell 44P) across columns 132A–P. The distance is successively decremented by 0.020 microns. Row 130L tests the necessary overlap of interconnect 188 over region 156.

Figure 10:
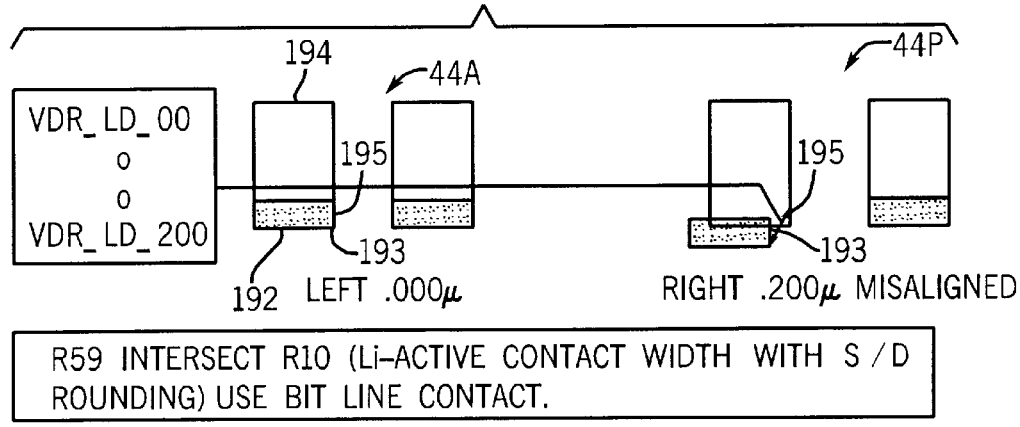
FIG. 10 is a block diagram of memory cells configured to test a LI to active contact width intersect design rule.

In FIG. 10, portions of cells 44A and 46P are identical except for an overlap between local interconnect active contact 192 and active region 194. Across row 130K, the offset is adjusted diagonally (equally in the X and Y directions). In other words, the distance between a corner 193 and a corner 195 is incremented from 0 (see memory cell 44A) to 0.100 nanometers (see memory cell 44P) across columns 132A–132K and incremented by 20 nanometers across columns 132K–132P. Row 130K tests the distance at which contact 192 is not connected to region 194.

Figure 11:
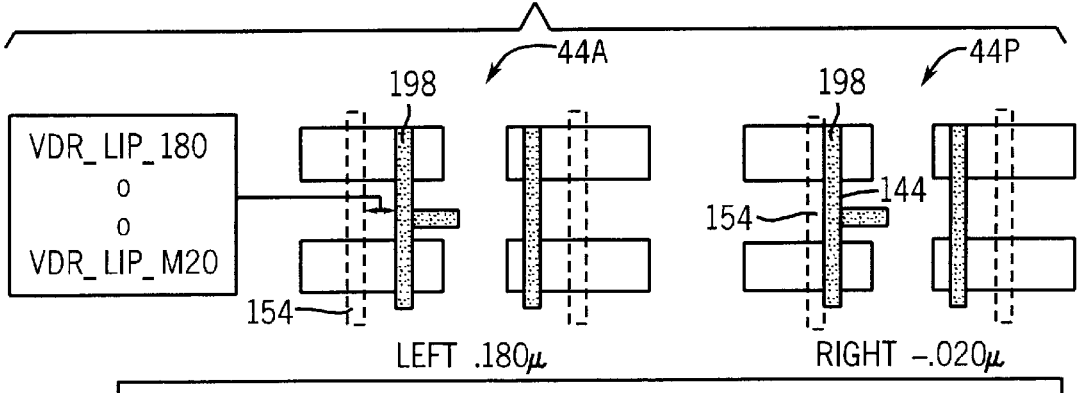
FIG. 11 is a block diagram of memory cells configured to test a LI to poly spacing design rule.

In FIG. 11, cells 44A and 44P are identical except that a distance between a T-shaped local interconnect 198 and polysilicon gate 154 is adjusted. The distance is adjusted in row 130J from 0.180 microns (see memory cell 44A) in column 132A to –0.020 microns (see memory cell 44P) in column 132P. A negative distance indicates that polysilicon gate 154 overlaps local interconnect 198. Row 130T tests at which point interconnect 198-(at the T portion) connects to polysilicon gate 154.

Figure 12:
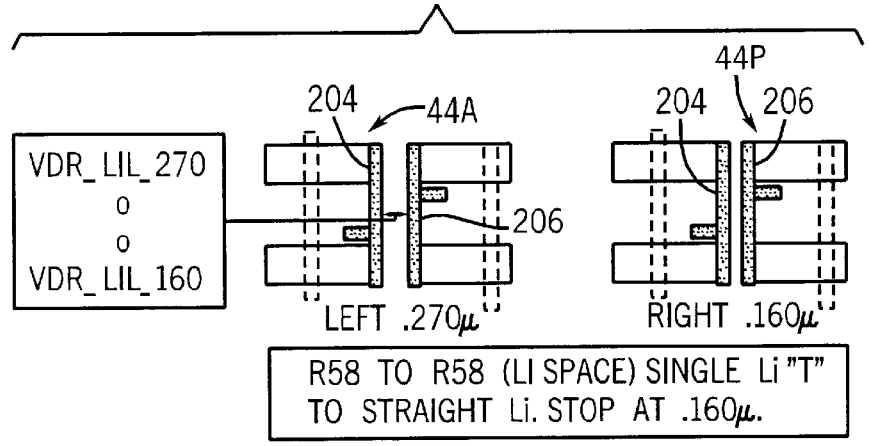
FIG. 12 is a block diagram of memory cells configured to test a T-shaped LI to LI spacing design rule.

In FIG. 12, cells 44A and 44P are identical except that a distance between local interconnects 204 and 206 is adjusted. The spacing is adjusted in row 1301 from 0.360 microns (see memory cell 44A) to 160 microns (see memory cell 44P) across columns 132A–132P. Preferably, the spacing is decremented by 0.020 microns across of columns 132A–132P. Row 1301 tests at which point interconnect 204 connects at the T portion to interconnect 206.

Figure 13:
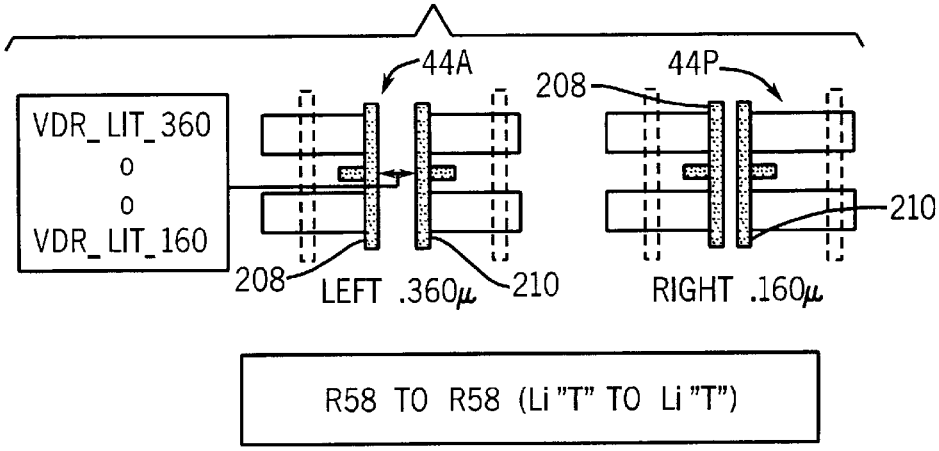
FIG. 13 is a block diagram of memory cells configured to test T-shaped LI to T-shaped LI spacing design rule.

In FIG. 13, cells 44A and 44P are identical except that a distance between two T-shaped local interconnects 208 and 210 is adjusted similarly to interconnects 204 and 206 discussed with reference to FIG. 12. A distance between interconnects 208 and 210 is adjusted in accordance with row 130H from 0.360 microns (see memory cell 44A) in column 132A to 0.160 microns (see memory cell 44P) in column 132P. The distance is successively decremented by 0.020 micrometers across columns 132A–K. Row 130H tests at which point interconnect 208 (at the T portion) connects to interconnect 210 (at the T portion).

In FIG. 14, cells 44A and 44P are identical except that a distance between a first level contact 212 and a local interconnect 211 is adjusted from 0.270 microns (see memory cell 44A) in column 132A to 0.070 microns (see memory cell 44P) in column 132P in accordance with row 130G. The distance is successively decremented by 0.010 microns across columns 132A–K and by 0.020 microns across columns 132K–132P. Row 130G tests at which point interconnect 211 shorts to first level contact 212.

In FIG. 15, cells 44A and 44P are identical except that a 1×3 local interconnect 213 is adjusted with respect to a first level contact 214. The overlap of interconnect 213 is adjusted from 0 (see memory cell 44A) to 0.200 microns (see memory cell 44P) across columns 132A–P in accordance with row 130F. Row 130F tests at which point contact 214 is not connected to interconnect 213.

Similar cells to cells 44A and 44P in FIG. 15 include a 1.5×2 local interconnect adjusted with respect to a first level contact from 0 microns to 0.200 microns in accordance with row 130E. The test of row 130E determines at which point the LI interconnect is no longer connected to the first level contact.

Figure 16:
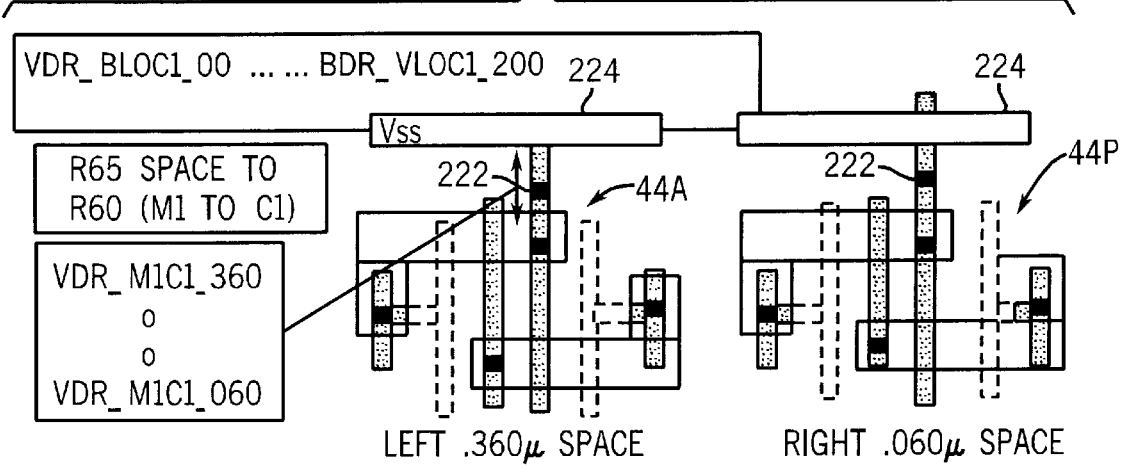
FIG. 16 is a block diagram of memory cells configured to test a first level metal layer overlap of a first level contact 1 design rule.

In FIG. 16, cells 44A and 44P are identical except that a space from a contact 222 to a metal line 224 is adjusted from 0.360 microns (see memory cell 44A) to 0.060 microns (see memory cell 44P) in accordance with row 130D across columns 132A–P. The distance or spacing is adjusted by 0.020 microns per column. Row 130D tests at which point contact 222 connects to line 224.

Figure 17:
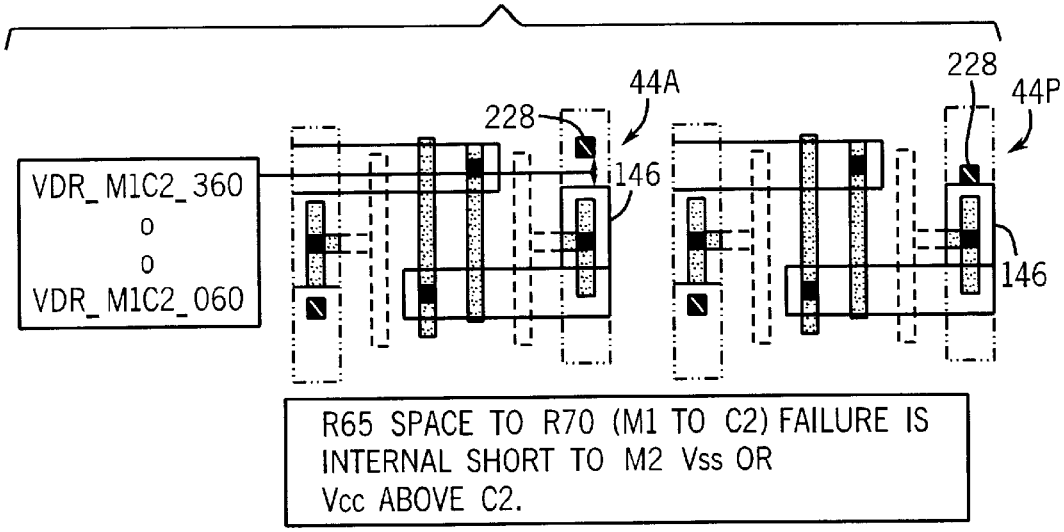
FIG. 17 is a block diagram of memory cells configured to test a first level metal layer to second contact spacing design rule.

In FIG. 17, cells 44A and 44P are identical except that a spacing from a second level contact 228 to a conductive line 146 in a metal one layer is adjusted from 0.360 microns (see memory cell 44A) to 0.060 microns (see memory cell 44P) in accordance with row 130C across columns 132A–P. The spacing is successively decremented by 0.020 microns across columns 132A–P. Row 130C determines at which point a short circuit occurs between contact 228 and line 146.

Figure 18:
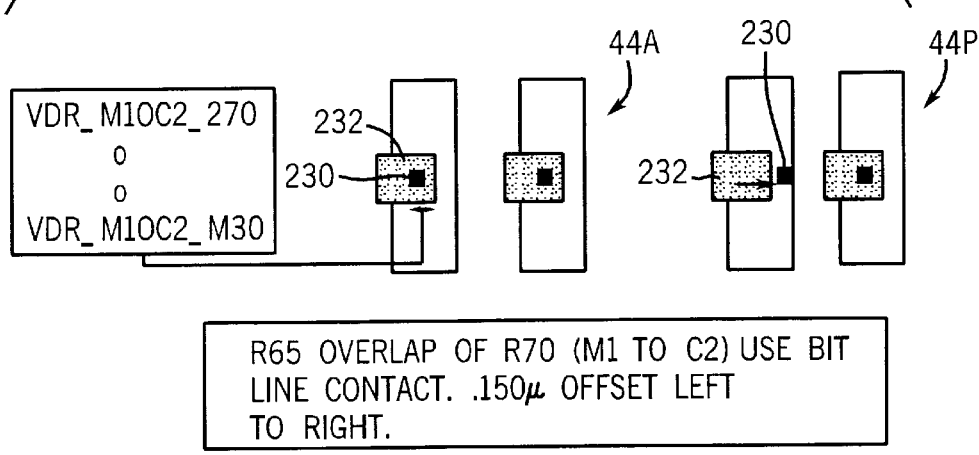
FIG. 18 is a block diagram of memory cells configured to test a first level metal layer to second level contact overlap design rule.

In FIG. 18, cells 44A and 44P are identical except that a second level contact 230 is offset with respect to a conductive line 232 in a first metal layer from 0.270 microns (see memory cell 44A) to –0.030 microns (see memory cell 44P) according to row 130B. The negative offset means that contact 230 is separated from line 232. Preferably, contact 230 is a bit line contact which is offset from left to right. Row 130B tests at which point contact 230 is not connected to line 232.

Figure 19:
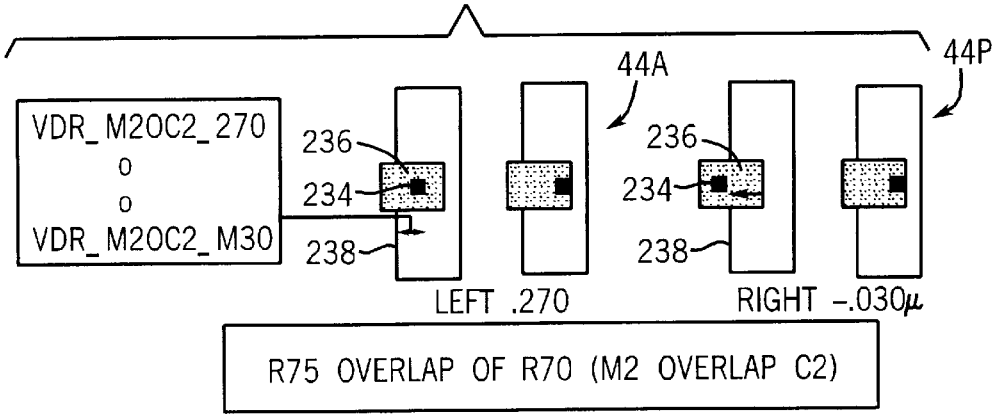
FIG. 19 is a block diagram of memory cells configured to test a second level metal layer to second level contact overlap design rule.

In FIG. 19, cells 44A and 44P are identical except that a second level contact 234 is offset with respect to a second level layer 236. Contact 234 is adjusted from a distance of 0.270 microns (see memory cell 44A) from the right of a border 239 to the left of border 238 in column 132A to a distance of 0.030 microns (see memory cell 44P) to the left of border 238 according to row 130A. Row 130A determines at which point an open circuit occurs between contact 236 and line 236.

Figure 20:
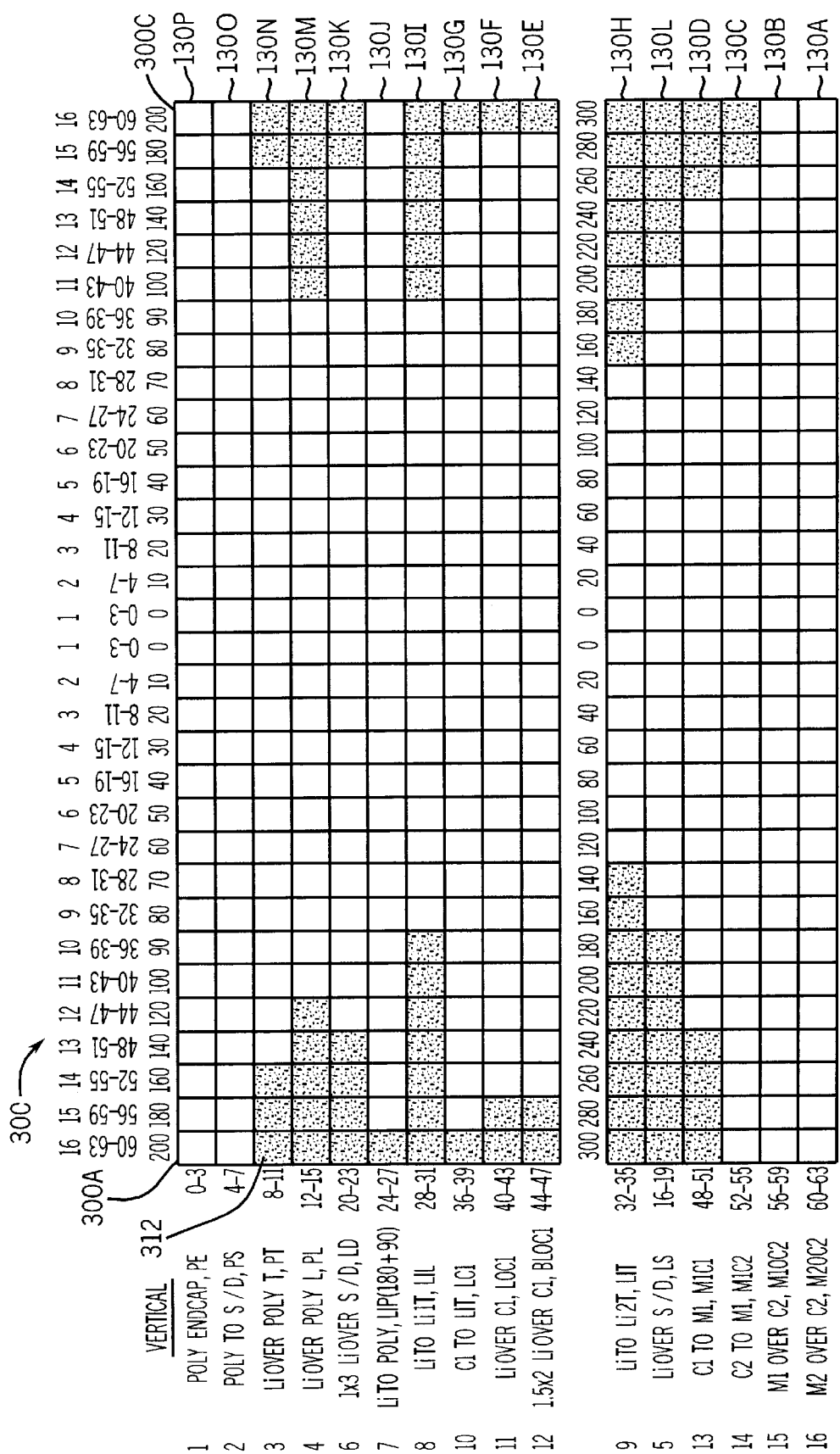
FIG. 20 is a block diagram of a vertical bit map representing testing results for the set of design rules illustrated in FIGS. 4–19.
Figure 21:
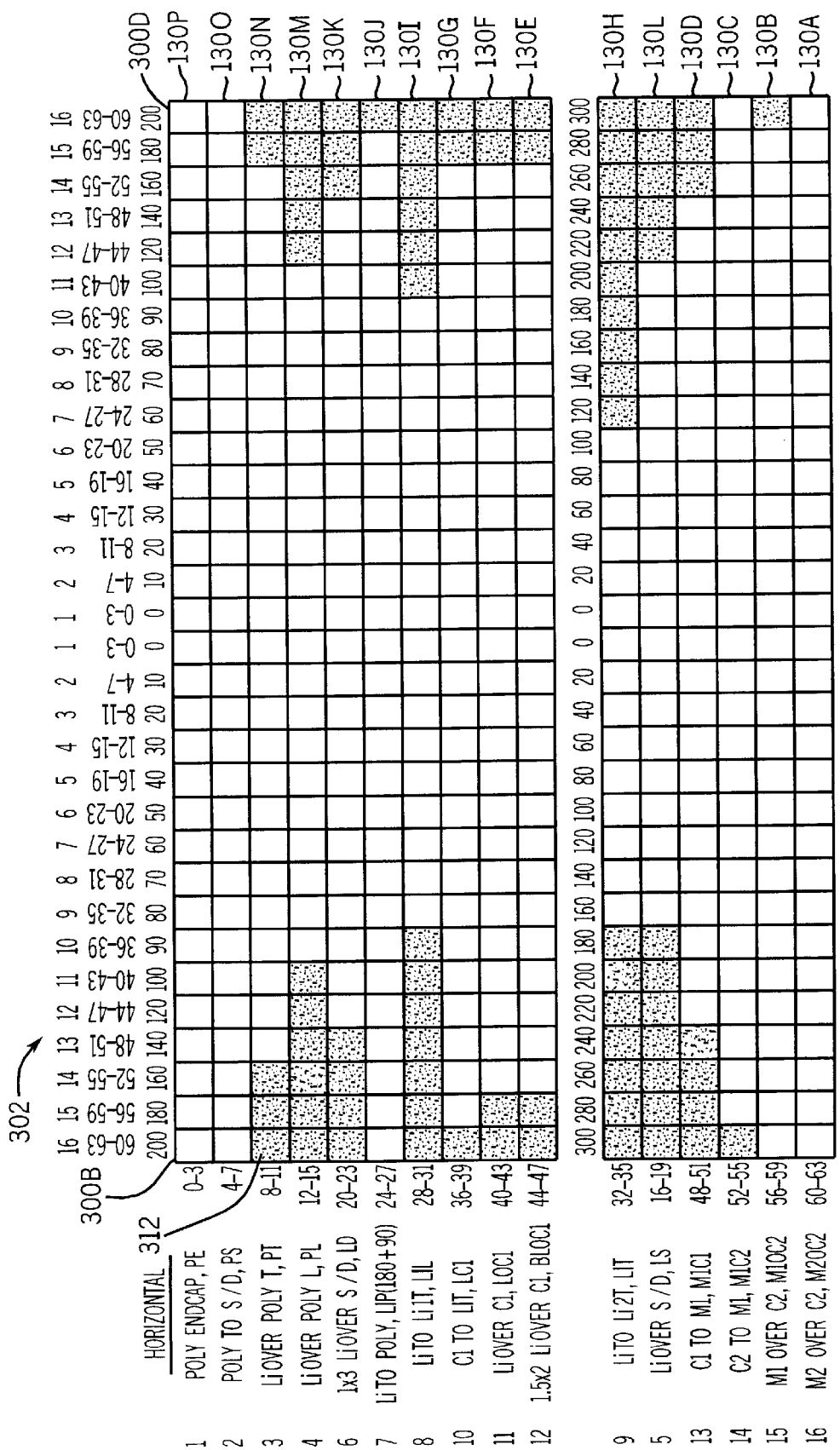
FIG. 21 is a block diagram of a horizontal bit map representing testing results for the set of design rules illustrated in FIGS. 4–19.

With reference to FIGS. 20 and 21, program 41 can process array 28 to create bit maps 300 and 302. Bit maps 300 and 302 include four sections 300A, 300B, 300C and 300D corresponding to matrix 32A, 32B, 32C and 32D (FIG. 4) respectively. Each of sections 300A–D includes sixteen rows and sixteen columns. The sixteen rows of sections 300A–D represent rows 130A–130P (FIG. 4). Bit maps 300 and 302 can be provided on display 45 (FIG. 1).

Each of bit maps 300 and 302 includes 32 columns wherein the first 16 columns correspond to columns 132P-A and the second sixteen columns correspond to columns 132A–132P. Accordingly, the safest parameters (e.g., parameters wherein the design was least stressed) are included in the center of 300 and 302 bit map and the most stressed parameters are provided on the ends of 300 and 302 bit map). Dark areas 312 on bit map 302 represent units which have failed (are not operational). For example, units 42 associated with row 130N failed when the offset parameter was equal to 0.160 micrometers and 0.180 micrometers. This indicates that interconnect 174 cannot be offset from conductor 154 by more than 0.180 microns.

In addition, failures can also determine horizontal and vertical alignment problems. For example, row 130D of bitmap 302, indicate that the matrix 22B failed at 0.160 microns and matrix 32D failed at 0.140 microns . Accordingly, a 0.010 micrometer misalignment exists between the second contact level A and first metal layer $((0.160-0.140)/2=0.010)$ ($^{0.160-0.140}/2=0.010$). Other alignment errors can be similarly calculated.

It is understood that, while detailed drawings and examples have been given, the details are provided for exemplary purposes only. For example, the particular set of design rule and types of memory units are shown for illustration only. Various changes may be made to the details disclosed without departing from the spirit of the invention which is defined by the following:

What is claimed is:

1. A variable design rule tool, comprising:
   a matrix of units having a plurality of rows and columns, the matrix being disposed on a semiconductor substrate, wherein the units in a particular row or column are associated with a semiconductor fabrication design rule, wherein a parameter associated with the design rule is greatest at a first end of the row or column and the parameter associated with the design rule is least at a second end of the row or column;
   an interface couplable to the matrix, the interface receiving digital data associated with the units; and
   a program receiving the digital data from the interface, the program determining a failure point associated with the parameter in response to the digital data.

2. The variable design rule tool of claim 1, wherein the matrix is a memory.

3. The variable design rule tool of claim 2, wherein each unit is written a first value, read, written a second value, and read, wherein the data includes an indication of whether the unit stored the first value and the second value.

4. The variable design rule tool of claim 3, wherein the matrix is a static random access memory array.

5. The variable design rule tool of claim 1, wherein the semiconductor fabrication design rule is one of the following: metal 2 over contact 2 spacing, metal 1 over contact 2 spacing, contact 2 to metal 1 spacing, contact 1 to metal 1 spacing, 1.5×2 local interconnect over contact 1 spacing, local interconnect over contact 1 spacing, contact 1 to local interconnect T spacing, local interconnect to local interconnect 2T spacing, local interconnect to local interconnect 1T spacing, local interconnect to polysilicon spacing, 1×3 local interconnect over source/drain spacing, local interconnect over source/drain spacing, local interconnect over polysilicon L spacing, local interconnect over polysilicon T spacing, polysilicon to source/drain spacing, or polysilicon end cap spacing.

6. The variable design rule tool of claim 3, wherein each unit is comprised of sixteen memory cells.

7. The variable design rule tool of claim 6, wherein a unit is considered failed if five cells do not store the first value or the second value.

8. The variable design rule tool of claim 7, wherein the unit is considered failed where two adjacent units fail.

9. The variable design rule tool of claim 1 further comprising three additional matrices at different orthogonal orientations from one another and from the matrix, wherein each of the matrix and additional matrices are subject to the semiconductor fabrication design rule for a row or column.

10. In a design test for a semiconductor fabrication system, the design test determining a particular value for a parameter associated with a design rule, the particular value being associated with a device failure on a wafer, the wafer comprising:
    a plurality of memory units, the units each being associated with an associated value for the parameter, wherein the associated value varies across a range for the units, wherein the design test allows the particular value to be determined in response to data associated with the units.

11. The wafer of claim 10, wherein the units are arranged in rows and columns, the units in a particular row or column being associated with the parameter.

12. The wafer of claim 11, wherein the units are comprised of a four-by-four memory cell array.

13. The wafer of claim 12, wherein the units are arranged in four matrices.

14. The wafer of claim 13, wherein the matrices are orthogonally oriented with respect to each other.

15. A method of testing a design rule for an integrated circuit, the integrated circuit including a plurality of memory units, the units being arranged in a plurality of rows and a plurality of columns, wherein the units in a particular row or a particular column are associated with a particular design rule, wherein a parameter associated with the design rule varies from a first end to a second end of the particular row or column, the method comprising:
    providing data to the units;
    receiving the data from the units;
    analyzing the data to determine if a unit has failed; and
    determining the parameter associated with the failed unit in response to the data by identifying the failed unit.

16. The method of claim 15 further comprising:
    providing second data to the units;
    receiving the second data from the units, wherein the analyzing step includes analyzing the second data.

17. The method of claim 15, wherein the analyzing step further includes filtering the data to determine adjacent failed units.

18. The method of claim 15, wherein the units each include a four-by-four array of SRAM devices.

19. The method of claim 18, wherein the failed unit has more than five failed devices.

20. The method of claim 15, wherein the design rule is related to lithographic spacing.

21. A variable design rule tool, comprising:
a matrix of units having a plurality of rows and columns, the matrix being disposed on a substrate, wherein the units in a particular row or column are associated with a fabrication design rule, wherein a parameter associated with the design rule varies at a first end of the row or column to the second end of the row or column;
an interface couplable to the matrix, the interface receiving digital data associated with the units; and
a program receiving the digital data from the interface, the program determining a failure point associated with the parameter in response to the digital data.

\* \* \* \* \*